(12) United States Patent
Kim et al.

(10) Patent No.: US 12,113,102 B2
(45) Date of Patent: Oct. 8, 2024

(54) SEMICONDUCTOR DEVICE WITH GUARD RING ISOLATING POWER DEVICE

(71) Applicant: SK keyfoundry Inc., Cheongju-si (KR)

(72) Inventors: Kwangil Kim, Cheongju-si (KR); Taehoon Lee, Sejong-si (KR); Hyunchul Kim, Chilgok-gun (KR); Insu Jung, Daegu-si (KR); Kyungbae Lee, Seoul (KR)

(73) Assignee: SK keyfoundry Inc., Cheongju-si (KR)

( * ) Notice: Subject to any disclaimer, the term of this patent is extended or adjusted under 35 U.S.C. 154(b) by 403 days.

(21) Appl. No.: 17/575,166

(22) Filed: Jan. 13, 2022

(65) Prior Publication Data
US 2022/0399437 A1  Dec. 15, 2022

(30) Foreign Application Priority Data
Jun. 14, 2021  (KR) ......................... 10-2021-0076469

(51) Int. Cl.
*H01L 29/06* (2006.01)
*H01L 29/08* (2006.01)
*H01L 29/10* (2006.01)
*H01L 29/78* (2006.01)

(52) U.S. Cl.
CPC ...... *H01L 29/0623* (2013.01); *H01L 29/0878* (2013.01); *H01L 29/1095* (2013.01); *H01L 29/7816* (2013.01)

(58) Field of Classification Search
CPC ..................... H01L 29/0623; H01L 29/1095
See application file for complete search history.

(56) References Cited

U.S. PATENT DOCUMENTS

| | | |
|---|---|---|
| 6,924,531 B2 | 8/2005 | Chen et al. |
| 7,224,025 B2 | 5/2007 | Tsai et al. |
| 8,110,853 B2 | 2/2012 | Voldman |
| 8,227,871 B2 | 7/2012 | Ko |

(Continued)

FOREIGN PATENT DOCUMENTS

| | | |
|---|---|---|
| KR | 10-2010-0064262 A | 6/2010 |
| KR | 10-2013-0113750 A | 10/2013 |
| KR | 10-2140358 B1 | 8/2020 |

OTHER PUBLICATIONS

Korean Office Action issued on Sep. 16, 2022, in counterpart Korean Patent Application No. 10-2021-0076469 (7 pages in Korean).

*Primary Examiner* — Anthony Ho
(74) *Attorney, Agent, or Firm* — NSIP Law (57) ABSTRACT

A power device and a guard ring structure surrounding the power device are provided. The power device includes: a buried layer of a first conductivity type and a buried layer of a second conductivity type disposed within a substrate; a body region of the first conductivity type and a drift region of the second conductivity type disposed on the buried layer of the first conductivity type; and a gate electrode, a source electrode, and a drain electrode disposed on the body region of the first conductivity type and the drift region of the second conductivity type. The guard ring structure includes: a first guard ring of the second conductivity type adjacent to the power device; a second guard ring of the first conductivity type adjacent to the first guard ring; and a third guard ring of the second conductivity type adjacent to the second guard ring.

15 Claims, 9 Drawing Sheets

(56) References Cited

U.S. PATENT DOCUMENTS

| | | |
|---|---|---|
| 8,344,416 B2 | 1/2013 | Sheu et al. |
| 8,754,474 B2 | 6/2014 | Ko |
| 9,054,180 B2 | 6/2015 | Chang et al. |
| 9,385,185 B2 | 7/2016 | Chang et al. |
| 10,074,644 B2 | 9/2018 | Kim et al. |
| 2018/0182747 A1* | 6/2018 | Kim ................... H10B 61/00 |
| 2020/0212176 A1 | 7/2020 | Koshimizu et al. |

* cited by examiner

SEMICONDUCTOR DEVICE WITH GUARD RING ISOLATING POWER DEVICE

CROSS-REFERENCE TO RELATED APPLICATIONS

This application claims the benefit under 35 USC § 119(a) of Korean Patent Application No. 10-2021-0076469, filed on Jun. 14, 2021, the entire disclosure of which is incorporated herein by reference for all purposes.

BACKGROUND

1. Field

The following description relates to a semiconductor device with a guard ring isolating power device.

2. Description of Related Art

A high-voltage power device embedded within a power management integrated circuit (PMIC) may be manufactured together in a semiconductor chip including various circuits such as an analog block, a digital block, a memory block, etc. Therefore, a low-voltage CMOS device, etc., may be positioned around the high-voltage power device. In view of the high voltage operation of the high-voltage power device, noise problems may occur with the adjacent low-voltage CMOS device.

Various types of guard rings are provided in order to remove noise generated from the power device. In an example, a parasitic bipolar transistor (e.g., a parasitic NPN transistor, a parasitic PNP transistor) within the power device may operate from time to time. Accordingly, a generated parasitic current may act as noise to other circuit blocks or may cause latch-up.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a semiconductor device includes a power device; and a guard ring structure which is disposed to surround the power device, wherein the power device includes a buried layer of a first conductivity type, and a buried layer of a second conductivity type each layer disposed within a substrate; a body region of the first conductivity type and a drift region of the second conductivity type which are disposed on the buried layer of the first conductivity type; and a gate electrode, a source electrode, and a drain electrode which are disposed on the body region of the first conductivity type and the drift region of the second conductivity type, wherein the guard ring structure includes a first guard ring of the second conductivity type disposed adjacent to the power device; a second guard ring of the first conductivity type disposed adjacent to the first guard ring; and a third guard ring of the second conductivity type disposed adjacent to the second guard ring, and wherein the buried layer of the second conductivity type is disposed to extend to the guard ring structure.

The first conductivity type may be different from the second conductivity type.

The first guard ring may be configured to surround the power device, the second guard ring may be configured to surround the first guard ring, and the third guard ring may be configured to surround the second guard ring.

The semiconductor device may further include a second conductivity type deep well region disposed between the buried layer of the second conductivity type and the guard ring structure, wherein the guard ring structure may be disposed on the second conductivity type deep well region.

Each of the first guard ring and the third guard ring may include: a second conductivity type well; and a second conductivity type impurity layer which is disposed within the second conductivity type well, and the second guard ring may include a first conductivity type well; and a first conductivity type impurity layer which may be disposed within the first conductivity type well.

The guard ring structure may further include a fourth guard ring of the first conductivity type disposed adjacent to the third guard ring; and a fifth guard ring of the second conductivity type disposed adjacent to the fourth guard ring.

The first guard ring, the second guard ring, and the third guard ring may be configured to receive a same bias voltage.

In a general aspect, a semiconductor device includes a power device, which is disposed on a substrate, and comprising a gate electrode, a source electrode, and a drain electrode; and a guard ring structure which is configured to surround the power device, wherein the guard ring structure includes an N-type first guard ring disposed adjacent to the power device; a P-type second guard ring disposed adjacent to the N-type first guard ring; and an N-type third guard ring disposed adjacent to the P-type second guard ring, and wherein the N-type first guard ring, the P-type second guard ring, and the N-type third guard ring are configured to receive a same first bias.

The guard ring structure may further include a P-type fourth guard ring disposed adjacent to the N-type third guard ring; and an N-type fifth guard ring disposed adjacent to the P-type fourth guard ring.

Each of the N-type first guard ring and the N-type third guard ring may include an N-type well; and an N-type impurity layer which may be disposed within the N-type well, and wherein the P-type second guard ring may include a P-type well; and a P-type impurity layer which is disposed within the P-type well.

The power device may further include an N-type buried layer disposed in a substrate; a P-type buried layer disposed on the N-type buried layer; a P-type body region and an N-type drift region disposed on the P-type buried layer; an N-type source region disposed in the P-type body region; and an N-type drain region disposed in the N-type drift region.

The semiconductor device may further include an N-type deep well region which may be configured to be in contact with lower portions of the first guard ring, the second guard ring, and the third guard ring, wherein the N-type deep well region may be disposed between the guard ring structure and the N-type buried layer.

The power device may be disposed in a power block, the power block may include a power supply voltage PVCC and a ground voltage PGND, wherein the first bias applied to the first guard ring, the second guard ring, and the third guard ring may be connected to the power supply voltage PVCC, wherein the drain electrode of the power device may be connected to the power supply voltage PVCC, so that the drain electrode and the guard ring structure may be connected to the same power supply voltage PVCC, and wherein a second bias may be applied to the substrate, and the second bias is connected to the ground voltage PGND.

The N-type deep well region and the P-type buried layer may be disposed adjacent to each other.

In a general aspect, a semiconductor device includes a power device; a circuit block region; a guard ring structure, configured to surround the power device, and a P-type well region, configured to surround the guard ring structure, and disposed between the circuit block region and the guard ring structure, wherein the guard ring structure includes an N-type first guard ring; a P-type second guard ring, and an N-type third guard ring.

The semiconductor device may include a first buried layer of a first conductivity type disposed in a substrate; a second buried layer of a second conductivity type disposed in the substrate, and a buried high voltage deep N-type well region disposed in the substrate between the guard ring structure and the first buried layer.

The N-type first guard ring, the P-type second guard ring, and the N-type third guard ring may be configured to receive a same bias voltage.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

In addition, terms such as first, second, A, B, (a), (b), and the like may be used herein to describe components. Each of these terminologies is not used to define an essence, order, or sequence of a corresponding component but used merely to distinguish the corresponding component from other component(s).

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

Also, in the description of example embodiments, detailed description of structures or functions that are thereby known after an understanding of the disclosure of the present application will be omitted when it is deemed that such description will cause ambiguous interpretation of the example embodiments.

Hereinafter, examples will be described in detail with reference to the accompanying drawings, and like reference numerals in the drawings refer to like elements throughout.

Figure 1A:
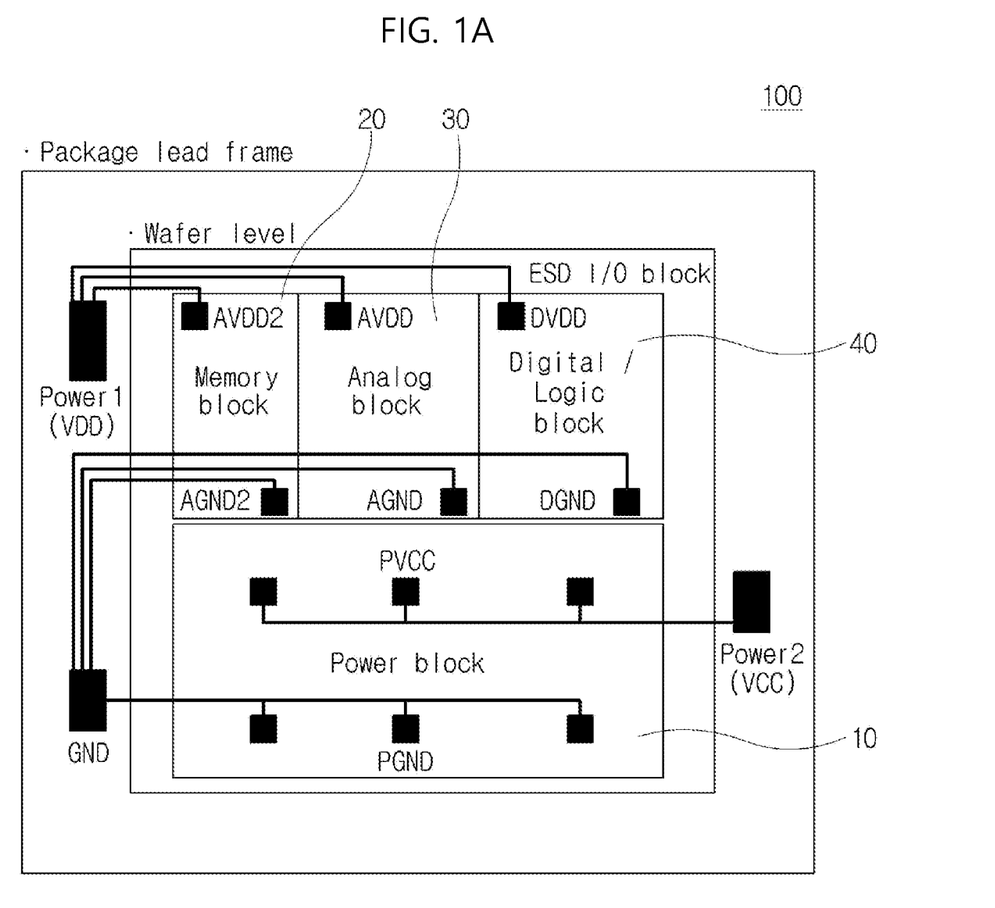
FIG. 1A illustrates an example semiconductor chip including various circuits such as a power block, an analog block, a digital block, a memory block, or the like, in accordance with one or more embodiments.

FIG. 1A illustrates an example semiconductor chip 100 including various circuits such as a power block 10, an analog block 30, a digital or logic block 40, a memory block 20, or the like.

Referring to FIG. 1A, the semiconductor chip (wafer level) may include various circuits such as the power block 10, the analog block 30, the digital block (or logic block) 40, the memory block 20, or the like. Additionally, an electrostatic discharge input/output (ESD I/O) block is disposed around the power block 10, the analog block 30, the digital block (or logic block) 40, and the memory block. 20

Power supply voltages AVDD2, AVDD, and DVDD to supply a power supply voltage may be disposed in the memory block 20, the analog block 30, and the digital block (or logic block) 40, respectively. Additionally, ground voltages AGND2, AGND, and DGND to supply a ground voltage may be respectively disposed in the memory block 20, the analog block 30, and the digital block (or logic block) 40. The power supply voltages AVDD2, AVDD, and DVDD may be connected to a first power supply voltage Power1 (VDD) disposed on a package lead frame. The ground voltages AGND2, AGND, and DGND may be connected to a ground voltage GND disposed on the package lead frame.

Similarly, a plurality of power supply voltages PVCC and a plurality of ground voltages PGND may be disposed on the power block 10. The plurality of power supply voltages PVCC may be tied together and connected to the second power supply voltage Power2 (VCC). The plurality of ground voltages PGND may also be connected to the ground voltage GND disposed on the package lead frame. As a result, the ground voltages AGND2, AGND, and DGND, and the plurality of ground voltages PGND may be connected to the ground voltage GND disposed on the package lead frame.

In an example, the first power supply voltage Power1 (VDD), the second power supply voltage Power2 (VCC), and one ground voltage GND may be formed on the package lead frame. In an example, the power supply voltages AVDD2, AVDD, and DVDD, the ground voltages AGND2, AGND, and DGND, the plurality of power supply voltages PVCC, and the plurality of ground voltages PGND may be formed on a wafer level. The wafer may include a plurality of ICs. The semiconductor chip illustrated in FIG. 1A may be obtained by packaging any one of the plurality of ICs.

Figure 1B:
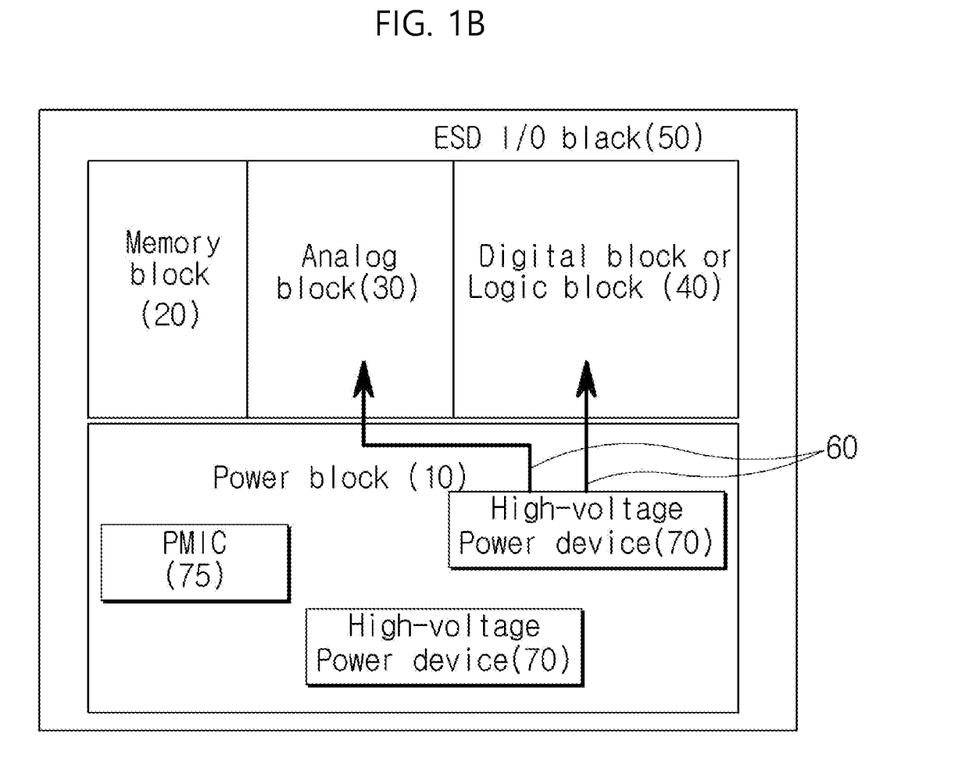
FIG. 1B illustrates an example semiconductor chip including the power block, the analog block, the digital block, the memory block, or the like other than a power supply voltage and a ground voltage of FIG. 1A.

FIG. 1B illustrates an example semiconductor chip including the power block 10, the analog block 30, the digital block or logic block 40, the memory block 20, or the like, without the power supply voltage and the ground voltage as illustrated in FIG. 1A.

Referring to FIG. 1B, the power block 10 may include a plurality of high-voltage power devices 70 and a power management integrated circuit (PMIC) 75. In an example, the high-voltage power devices 70 may operate at a voltage from, as only examples, 20 V to 120 V. Therefore, the power block 10 including the high-voltage power devices 70 which operate at a higher voltage may occupy a larger area than the memory block 20, the analog block 30, or the digital block (or logic block) 40.

Additionally, a plurality of low-voltage CMOS devices may be included in the analog block 30 or the digital block (or logic block) 40. Therefore, the low-voltage CMOS device, etc., may be positioned around the high-voltage power device. The low-voltage CMOS device disposed in the analog block 30, the digital block or logic block 40 or the like may operate, for example, at a low voltage of 1 V to 5 V.

In an example, due to a high operating voltage of the high-voltage power devices 70, noise 60 may be transmitted to the low-voltage CMOS device disposed in an adjacent analog block or digital block, etc. In order to block or reduce the noise 60, a guard ring structure may be beneficial. In an example, the noise 60 may mainly refer to drifting hole or electron carriers.

Figure 2:
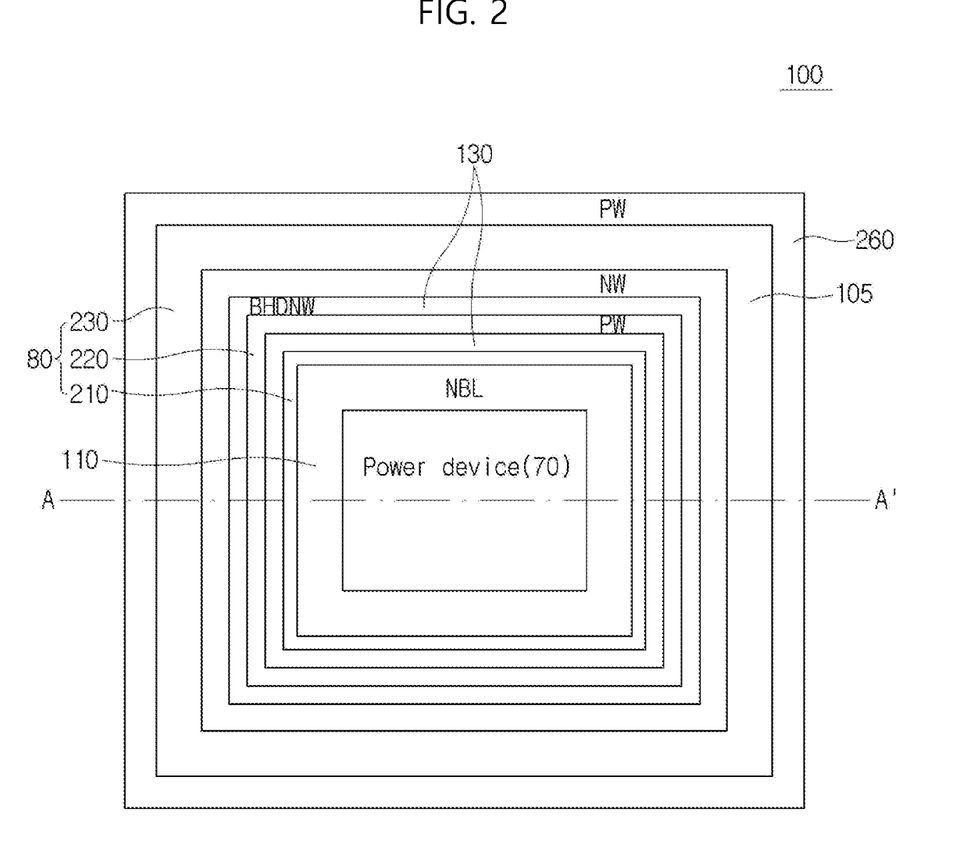
FIG. 2 illustrates a plan view of an example semiconductor device including a guard ring structure which surrounds an example power device, in accordance with one or more embodiments.

FIG. 2 illustrates a plan view of an example semiconductor device including a guard ring structure 80 which surrounds an example power device 70.

Referring to FIG. 2, an example semiconductor device 100 including the guard ring structure 80 surrounding the power device 70 positioned in the power block shown in FIG. 1B, is illustrated. The guard ring structure 80 surrounding the power device 70 may be installed in order to block the noise 60 generated by the power device 70 from moving to, or being transmitted to, neighboring blocks 20 to 40.

In an example, the guard ring structure 80 may be formed of various well regions. The guard ring structure 80 includes an N-type first guard ring 210, a P-type second guard ring 220, and an N-type third guard ring 230. The guard ring structure 80 may block the unwanted movement of the holes or electrons flowing to an adjacent element. Additionally, noise components caused by a parasitic diode or BJT operation may be blocked. Additionally, a first P-type well region (PW) 260 surrounding the guard ring structure 80 may be disposed. The first P-type well region (PW) 260 may serve to supply a ground voltage to a substrate and to capture the drifting of the hole carrier.

Figure 3:
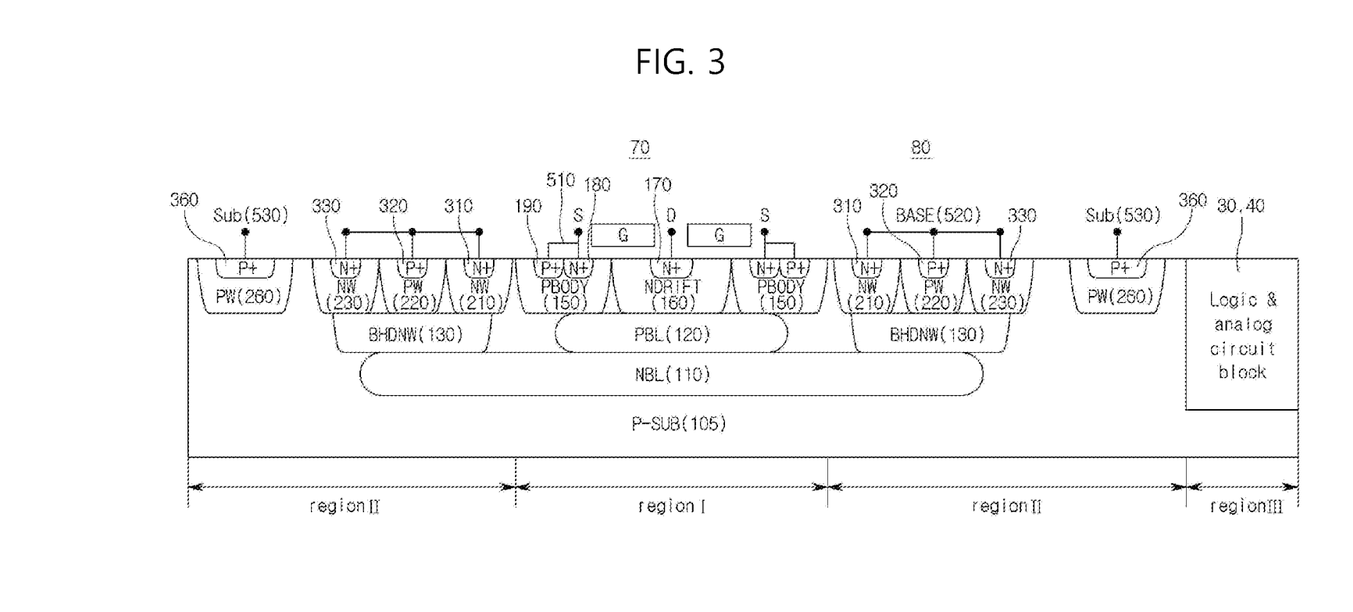
FIG. 3 illustrates a cross sectional view of a structure of an example semiconductor device including a hole suppression guard ring which surrounds an example power device, in accordance with one or more embodiments.

FIG. 3 is a cross sectional view of a structure of an example semiconductor device including a hole suppression guard ring which surrounds the power device 70, in accordance with one or more embodiments.

Referring to FIG. 3, FIG. 3 illustrates a cross-sectional view taken along line A-A' in FIG. 2. The semiconductor device 100, in accordance with one or more embodiments, includes a first region (region I), a second region (region II), and a third region (region III). The power device 70 may be formed in the first region (region I). In a non-limiting example, power device 70 may comprise an N-type or P-type LDMOS device. In the one or more examples, an N-type LDMOS device may be implemented as an example. In an example, the LDMOS device may also be configured in the form of an array. The power device 70 including the LDMOS device may include a gate electrode G, a source electrode S, and a drain electrode D.

The second region (region II) may be disposed between the first region (region I) and the third region (region III). The hole suppression guard ring structure 80 may be formed in the second region (region II).

The third region (region III) refers to a circuit block region adjacent to the second region (region II). In an example, a logic & analog circuit block may be formed in the third region (region III).

First, referring to the first region (region I), the substrate may include, in an example, a base substrate P-SUB 105 of a first conductivity type (e.g., P-type). In a non-limiting example, the base substrate P-SUB may be a silicon substrate, a gallium arsenide substrate, a silicon germanium substrate, a ceramic substrate, a quartz substrate, a glass substrate for display, or the like, or may be a semiconductor on insulator (SOI) substrate.

Subsequently, a first buried layer (hereinafter, referred to as NBL) 110 and a second buried layer (hereinafter, referred to as PBL) 120 may be formed within the base substrate P-SUB. The NBL 110 may be formed of a second conductivity type (N-type), and the PBL 120 may be formed of a first conductivity type (P-type). The NBL 110 may be formed in the first region (region I) and the second region (region II), and the PBL 120 may be formed on the NBL 110 in the first region (region I).

In the LDMOS 70 of the second conductivity type (N-type), the source electrode S may be disposed on both sides of the drain electrode D. The disposition of the source electrode S and the drain electrode D may reduce the area of the LDMOS 70. The LDMOS 70 may include the gate electrode G, the drain electrode D, the source electrode S, a drain region, a source region, and a pick-up region. The gate electrode G is formed of poly-silicon or metal. The drain electrode D and the source electrode S refer to contact plugs. In an example, the drain electrode D may be connected to an output node. The drain electrode D may be formed on the drain region 170. The source electrode S may be formed on the source region 180 and the pick-up region 190. The pick-up region 190 has a first conductivity type (P-type), and the drain region 170 and the source region 180 have the second conductivity type (N-type).

The drain region 170 may be formed within a drift region (hereinafter, referred to as NDRIFT) 160 of the second conductivity type (N-type). The drain region 170 may have a higher concentration than a concentration of the NDRIFT 160. Additionally, the source region 180 and the pick-up region 190 are formed in a body (hereinafter, referred to as PBODY) 150 of the first conductivity type (P-type). The PBODY 150 is a channel region. The PBL 120 is disposed between the NDRIFT 160 and the NBL 110.

The LDMOS 70, in accordance with one or more embodiments, may have a fully isolated structure. This is because the NDRIFT 160 may be completely surrounded by the PBODY 150 and the PBL 120. That is, the NDRIFT 160 may be isolated from the substrate P-SUB, and may also be isolated from the NBL 110 by the PBL 120. The PBL 120 may be in direct contact with the PBODY 150, the NDRIFT 160, and the NBL 110. The PBL 120 may be formed, so that a higher withstand voltage may be formed. The formation of the PBL 120 may also help to increase the concentration of the NDRIFT 160 to a certain extent. Thus, the current capability of the LDMOS device 70 may be further increased. This may allow the device to operate at lower resistances, which may also increase the switching speed. In an example, the length of the PBL 120 may be less than the length of the NBL 110.

Next, the hole suppression guard ring structure 80 may be formed in the second region (region II). The hole suppression guard ring structure 80 may be formed adjacent to the LDMOS 70, to surround the LDMOS 70. The hole suppression guard ring structure 80 includes a first guard ring 210 of the second conductivity type formed adjacent to the power device or LDMOS 70, a second guard ring 220 of the first conductivity type formed adjacent to the first guard ring 210, and a third guard ring 230 of the second conductivity type formed adjacent to the second guard ring 220.

The first guard ring 210 may be configured to surround the power device 70, the second guard ring 220 may be configured to surround the first guard ring 210, and the third guard ring 230 may be configured to surround the second guard ring 220.

The first guard ring 210 may include a second conductivity type well NW 210 and a second conductivity type impurity layer N+ 310 formed within the second conductivity type well NW 210.

The second guard ring 220 may include a first conductivity type well PW 220 and a first conductivity type impurity layer P+ 320 formed within the first conductivity type well PW 220.

The third guard ring 230 may include a second conductivity type well NW 230 and a second conductivity type impurity layer N+ 330 formed within the second conductivity type well NW 230.

A buried high voltage deep N-type well region (hereinafter, referred to as BHDNW) 130 may be formed below the hole suppression guard ring structure 80. The BHDNW 130 is formed between the NBL 110 and the guard ring structure 80. As shown in the cross sectional view, the BHDNW 130 may connect the NBL 110 with the NW 210, the PW 220, and the NW 230, which are included in the guard ring structures 80. The BHDNW 130 may be formed to overlap the NW 210, the PW 220, and the NW 230 respectively, which are included in the guard ring structure 80. The BHDNW 130 may be formed to extend further than the end of the NBL 110. The concentration of the BHDNW 130 may be formed to be less than the concentration of the NBL 110.

The N+ 310, the P+ 320, and the N+ 330 may be formed in the NW 210, PW 220, and NW 230, respectively. Additionally, the NW 210, the PW 220, and the NW 230 may all be formed or disposed to be in direct contact with the BHDNW 130. The BHDNW 130 may be formed in direct contact with the NBL 110.

The NBL 110 may be electrically connected to the NW 210, the PW 220, and the NW 230. Also, the NBL 110 is formed to overlap the NW 210, the PW 220, and the NW 230. Similarly, the BHDNW 130 may also be formed to overlap the NW 210, the PW 220, and the NW 230. The NBL 110 and the BHDNW 130 may also overlap with each other. While the PBL 120 and the BHDNW 130 may be formed apart from each other, both the PBL 120 and the BHDNW 130 may be formed on the NBL 110. Additionally, both the PBL 120 and the BHDNW 130 may be formed in similar positions, or may be formed on a same plane. That is, the PBL 120 and the BHDNW 130 may be formed adjacent to each other.

The NBL 110 may be formed to overlap the PBL 120, the BHDNW 130, the PBODY 150, the NDRIFT 160, the NW 210, the PW 220, and the NW 230. This is because the NBL 110 may be formed to extend horizontally from below the LDMOS device 70 to the BHDNW 130. Additionally, the NBL 110 may be electrically connected to the BHDNW 130, the NW 210, the PW 220, and the NW 230.

Additionally, the PBODY 150 of the LDMOS device 70 and the NW 210 of the first guard ring 210 may face each other, and may be located closest to, or adjacent to, each other. The NDRIFT 160 may be disposed to be spaced apart from the NW 210 of the first guard ring 210. This may be more advantageous in achieving electrical isolation from neighboring devices. It may be more advantageous that the NW 210 and the PBODY 150, which have opposite conductivity types, are disposed adjacent to each other, rather than the NDRIFT 160 and NW 210, which have the same conductivity type, being disposed adjacent to each other.

The P-type well region (PW) 260 may surround the guard ring structure 80, and it may be connected to the ground voltage PGND. A high concentration doped region (hereinafter, referred to as P+) 360 of the first conductivity type may be formed in the PW 260. The PW 260 and the P+ 360 may capture the hole carriers generated from the LDMOS 70, so that electrons or holes may not flow into the analog block 30 and the digital or logic block 40. The PW 260 and the P+ 360 may also be implemented as a pick-up region for the P-SUB. The PW 260 and the P+ 360 may be connected to the ground voltage PGND of the power block 10 (see FIGS. 1A and 1B). The PW 260 and the P+ 360 may be connected to a contact plug indicated by Sub 530. Therefore, the Sub 530 may be connected to the ground voltage PGND.

In FIG. 3, in the semiconductor device 100 in accordance with one or more embodiments, in terms of the operation of a parasitic PNP transistor, the source region 180 and the pick-up region 190 of the power device 70 may be regarded as an emitter region (Emitter) 510. The guard ring structure 80 may be regarded as a base region (BASE) 520. Additionally, the Sub 530 electrically connected to the substrate may become a collector region (Collector) 530. Thus, the drifting hole carriers may be generated from the emitter region (Emitter) 510, and may be collected in the collector region 530 via the base region 520. However, in an example, the base region 520 may capture a portion of the holes. Therefore, since the amount of holes flowing to the collector region 530 may be suppressed, the guard ring structure 80 may be called the hole suppression guard ring structure 80. In view of the hole suppression guard ring structure 80, the parasitic PNP transistor may operate, and thus, may suppress the movement of noise to another circuit block, for example, the analog block 30 or the digital or logical block 40. The hole (noise source) flowing from the high voltage semiconductor device 100 to the analog block 30 or the digital or logical block 40 may be suppressed.

The first guard ring 210, the second guard ring 220, and the third guard ring 230 are characterized in that they may be supplied with the same bias. The first guard ring 210, the second guard ring 220, and the third guard ring 230 may be tied together to the BASE 520 by using a metal wiring. A first bias BIAS1 may be applied to the BASE 520 node. The first bias may be the first power supply voltage PVCC1 of the power block 10. The base region (BASE) 520 may be connected to the power supply voltage PVCC of the power block 10.

Additionally, a second bias BIAS2 may be applied to the drain region 170 of the LDMOS 70, and the second bias may be the second power supply voltage PVCC2. The first power supply voltage PVCC1 and the second power supply voltage PVCC2 of the power block 10 may be connected to the same power supply voltage PVCC. In this example, the same power supply voltage PVCC may be applied to the BASE 520 node of the guard ring structure 80 and the drain region 170 of the LDMOS 70. Alternatively, different biases may be applied to the BASE 520 node and the drain region 170 as needed.

Figure 4:
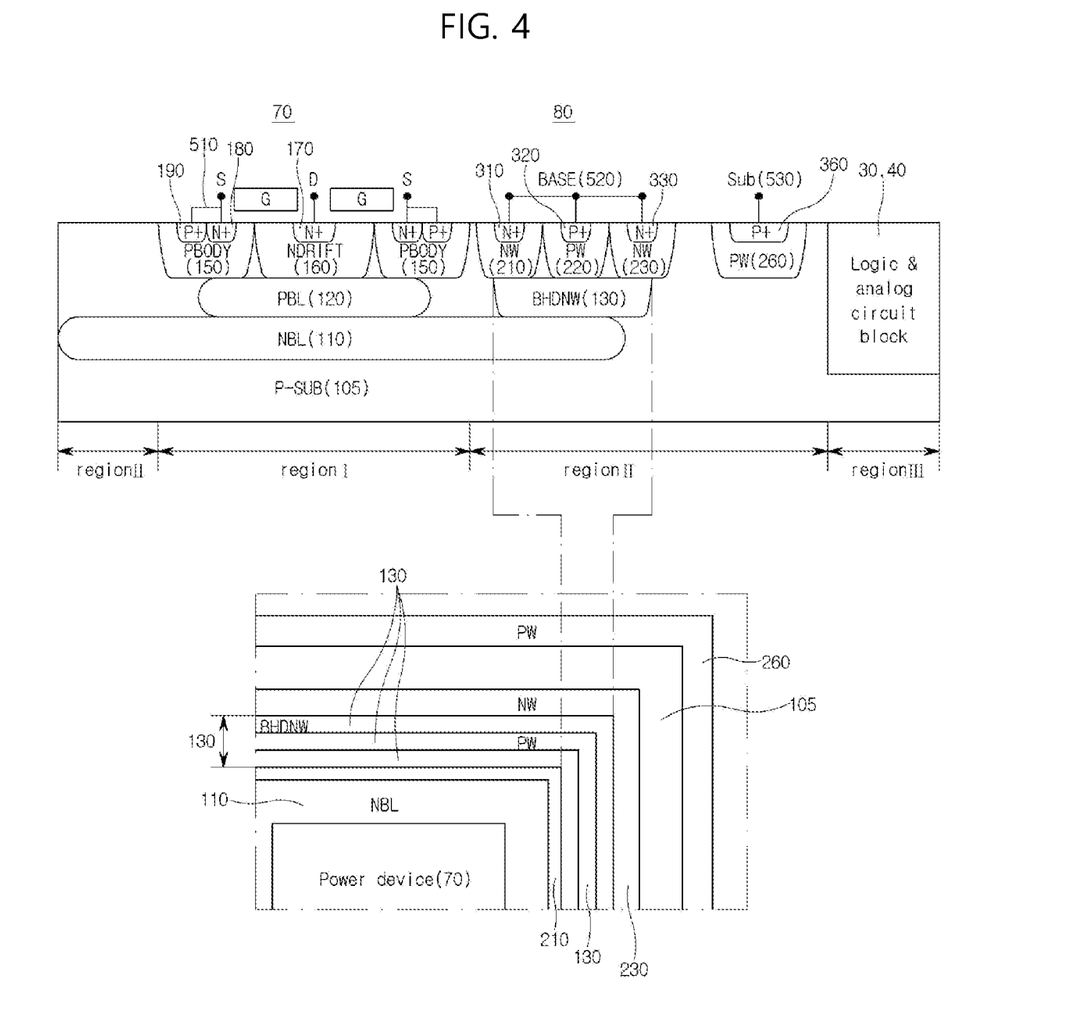
FIG. 4 illustrates a cross sectional view and a plan view together of an example semiconductor device including a hole suppression guard ring which surrounds an example power device, in accordance with one or more embodiments.

FIG. 4 illustrates a cross sectional view and a plan view together of an example semiconductor device including the hole suppression guard ring which surrounds the power device, in accordance with one or move embodiments.

Referring to FIG. 4, in order to correspond to a well structure in the cross-sectional view and a well structure in the plan view, some areas are indicated by connection lines (dotted lines). In an example, which portion in the plan view the width of the BHDNW 130 matches can be understood by following the connection lines (dotted lines). The BHDNW 130 may overlap the first guard ring 210 and the third guard ring 230, and may be disposed between them. The BHDNW 130 may also overlap the second guard ring 220, and the width of the BHDNW 130 may be formed to be greater than the width of the second guard ring 220.

Figure 5:
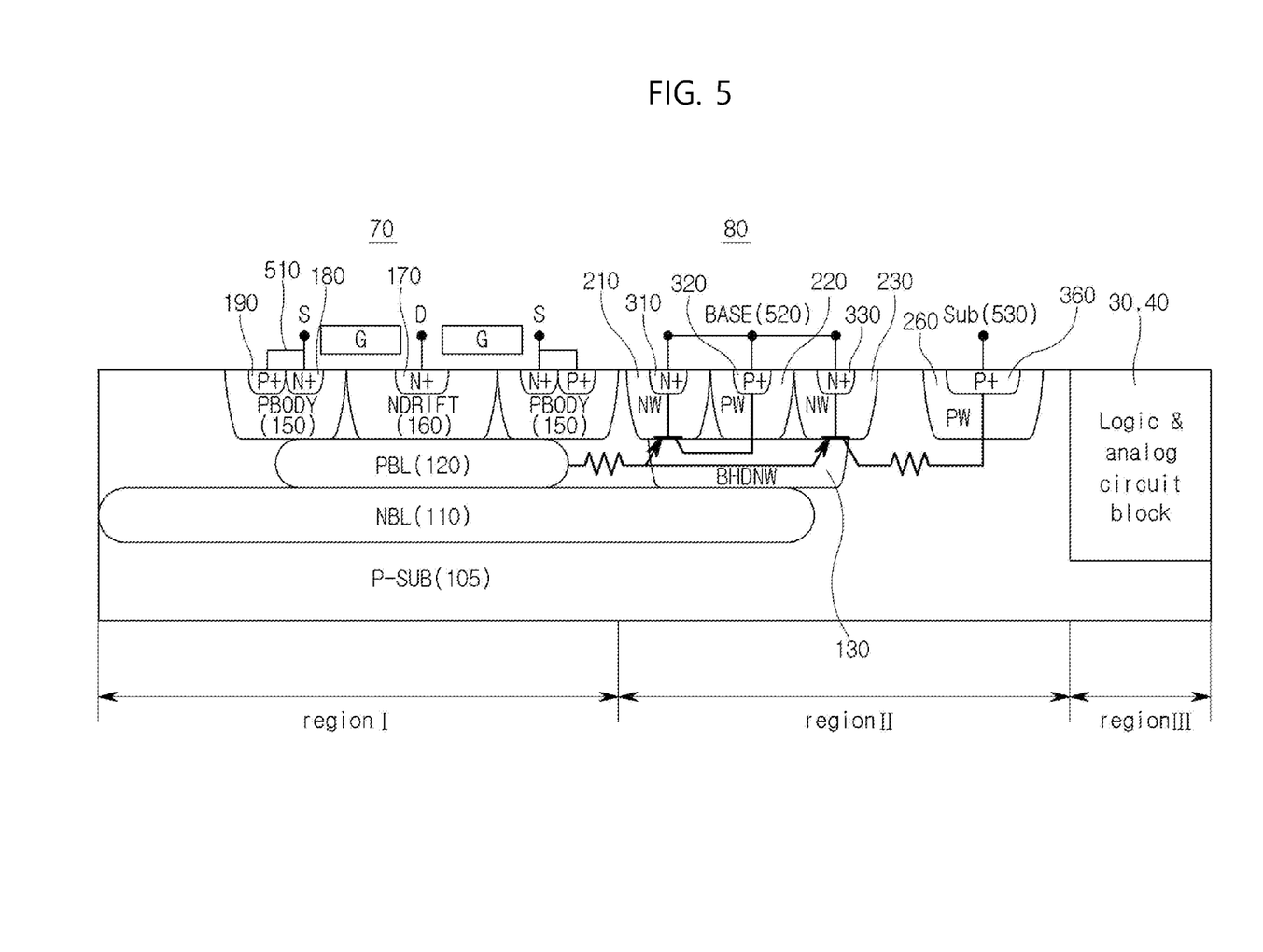
FIG. 5 illustrates operations of an example PNP bipolar transistor in a hole suppression guard ring structure which surrounds an example power device, in accordance with one or more embodiments.

FIG. 5 illustrates operations of a PNP bipolar transistor in the hole suppression guard ring structure 80 which surrounds the power device 70, in accordance with one or more embodiments.

As illustrated in FIG. 5, operations of a first parasitic PNP bipolar transistor PNP1 and a second parasitic PNP bipolar transistor PNP2 are shown. First, the PNP1 comprises the PBL 120, the NW 210, and the PW 220. In other words, the PBL 120 of the first region (region I), the first guard ring 210 of the second conductivity type (N-type) formed in the second region (region II), and the second guard ring 220 of the first conductivity type (P-type) constitute the first parasitic PNP bipolar transistor PNP1.

The second parasitic PNP bipolar transistor PNP2 comprises the PBL 120, the NW 230, and the PW 260. In other words, the PBL 120 of the first region (region I), the third guard ring 230 of the second conductivity type (N-type) formed in the second region (region II), and the PW 260 formed in the second region (region II) constitute the second parasitic PNP bipolar transistor PNP2.

When the parasitic PNP bipolar transistors represented by PNP1 and PNP2 operate, a hole current h+ flows to the parasitic bipolar transistor. Therefore, the flow of the hole current h+ to adjacent devices may be suppressed. Accordingly, noise in the horizontal direction may be reduced.

That is, due to the operation of the first and second parasitic PNP bipolar transistors PNP1 and PNP2 comprising the first to third guard rings 210, 220, and 230, the movement of the hole carriers toward adjacent devices can be suppressed. Most of the hole carriers are collected in the BASE 520 node.

Figure 6:
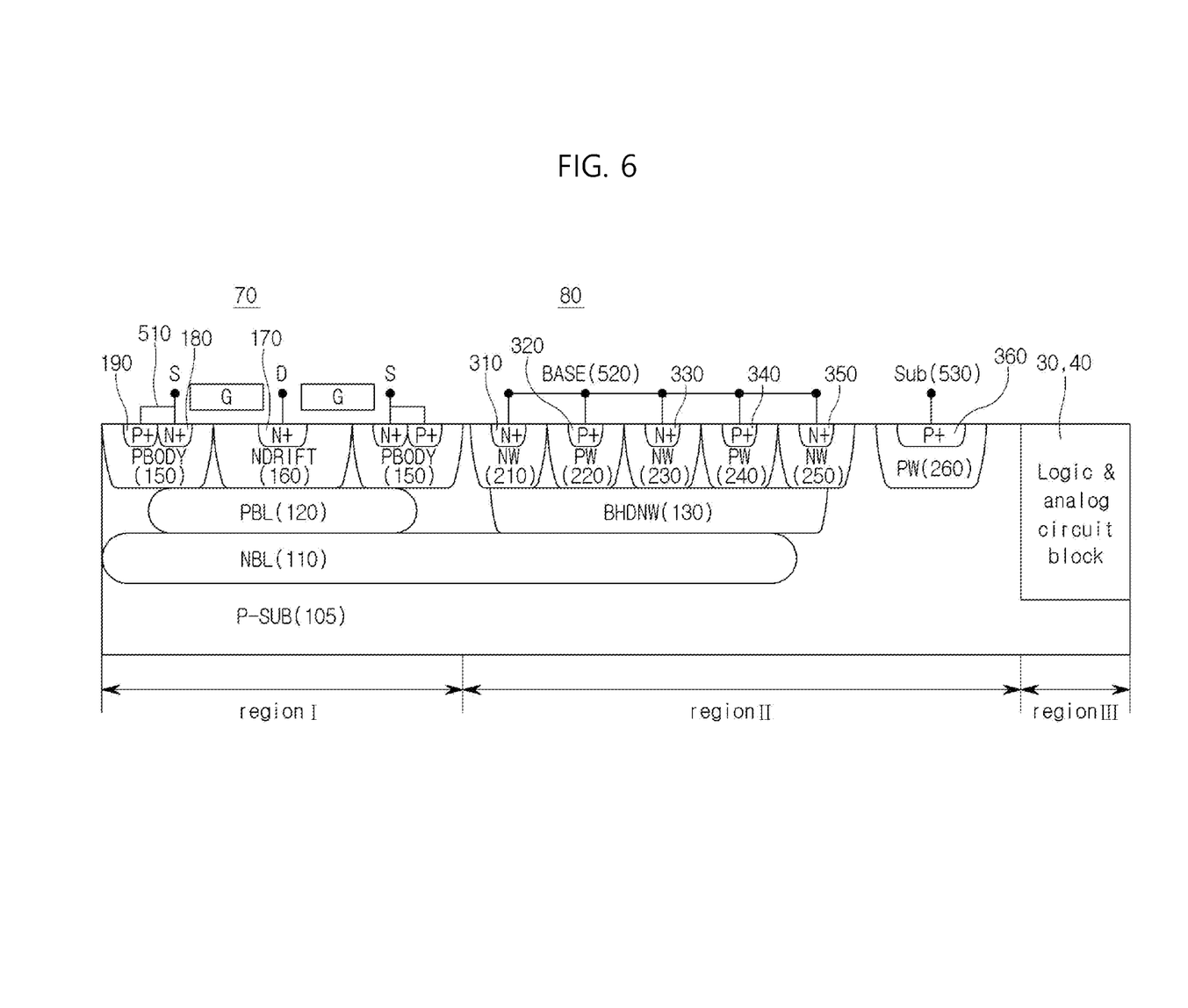
FIGS. 6 and 7 illustrate a structure of an example semiconductor device including a hole suppression guard ring which surrounds an example power device, in accordance with one or more embodiments.
Figure 7:
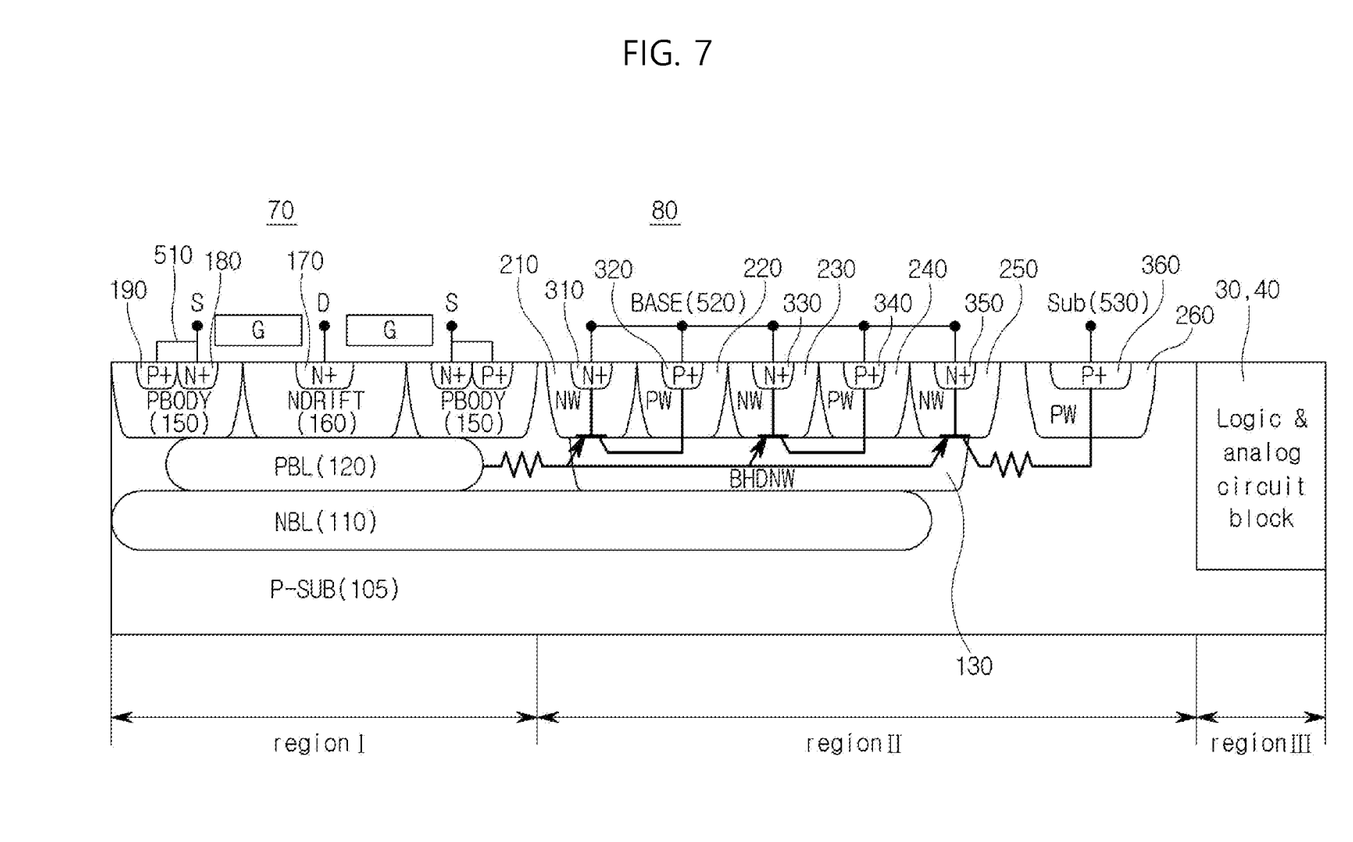

FIGS. 6 and 7 illustrate example structures of an example semiconductor device including the hole suppression guard ring which surrounds the power device, in accordance with one or more embodiments.

The embodiment of FIGS. 6 and 7 illustrate that the hole suppression guard ring structure 80 in the examples of FIGS. 3 and 5 may further include a fourth guard ring 240 and a fifth guard ring 250.

The fourth guard ring 240 may be formed adjacent to the third guard ring 230, and may be of a first conductivity type (P-type). The fifth guard ring 250 may be formed adjacent to the fourth guard ring 240, and may have a second conductivity type (N-type).

Since the examples of FIGS. 6 and 7 includes a larger number of the parasitic PNP bipolar transistors, noise may be further reduced.

Referring to FIG. 7, three parasitic PNP bipolar transistors PNP1, PNP2, and PNP3 may be formed.

First, as illustrated in FIG. 7, the first parasitic PNP bipolar transistor PNP1 comprises the PBL 120, the NW 210, and the PW 220. In other words, the PBL 120 of the first region (region I), the first guard ring 210 of the second conductivity type (N-type) formed in the second region (region II), and the second guard ring 220 of the first conductivity type (P-type) constitute the first parasitic PNP bipolar transistor PNP1.

The second parasitic PNP bipolar transistor PNP2 comprises the PBL 120, the NW 230, and the PW 240. In other words, the PBL 120 of the first region (region I), the third guard ring 230 of the second conductivity type (N-type) formed in the second region (region II), and the PW 240 formed in the second region (region II) constitute the second parasitic PNP bipolar transistor PNP2.

The third parasitic PNP bipolar transistor PNP3 comprises the PBL 120, the NW 250, and the PW 260. In other words, the buried layer of the first conductivity type of the first region (region I), the fifth guard ring 250 of the second conductivity type formed in the second region (region II), and the well 260 of the first conductivity type formed in the second region (region II) constitute the third parasitic PNP bipolar transistor PNP3.

Figure 8:
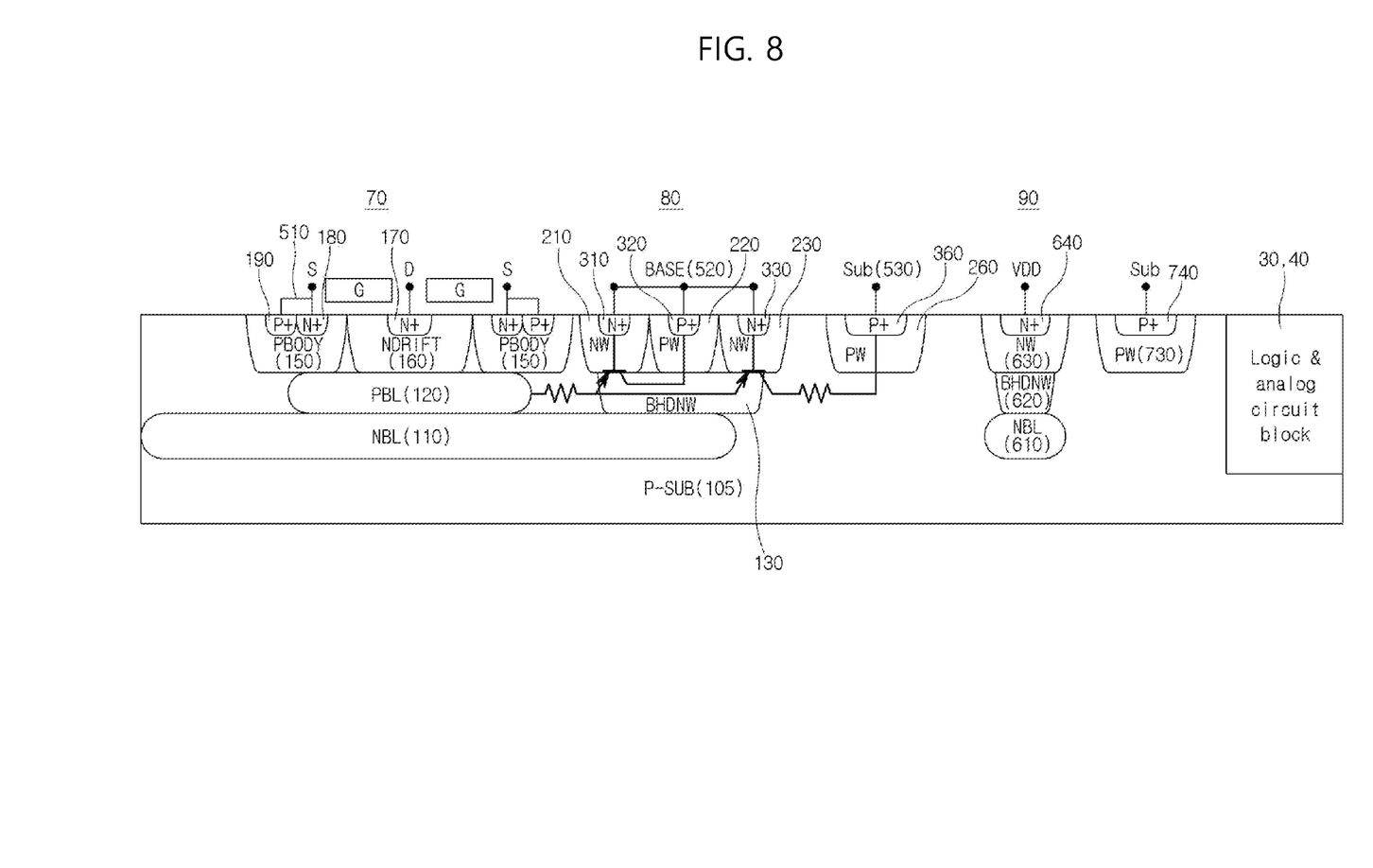
FIG. 8 illustrates a structure of an example semiconductor device including a guard ring which surrounds an example power device, in accordance with one or more embodiments.

FIG. 8 illustrates an example structure of an example semiconductor device including the guard ring which surrounds the power device, in accordance with one or more embodiments.

An electron suppression guard ring structure (second guard ring structure) 90, in addition to the hole suppression guard ring structure (first guard ring structure) 80, may be disposed. Unlike other examples, the electron suppression guard ring structure (second guard ring structure) 90 may be positioned between a second PW 730 and the first PW 260 connected to a ground power. The electron suppression guard ring structure 90 comprises an NBL 610, a BHDNW 620, an NW 630, and an N+ 640. The first P+ 360 and a second P+ 740 are formed in the first PW 260 and the second PW 730, respectively. Since not only the hole suppression guard ring structure 80 but also the electron suppression guard ring structure 90 may be provided, there is a disadvantage in that the area is increased. However, this structure is able to more reliably capture holes or electron carriers. Thus, it is possible to reliably block noise components flowing to the analog block 30 and the digital or logic block 40.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device, comprising:
a power device; and
a guard ring structure which is disposed to surround the power device,
wherein the power device comprises:
a buried layer of a first conductivity type, and a buried layer of a second conductivity type, each layer disposed within a substrate;
a body region of the first conductivity type and a drift region of the second conductivity type which are disposed on the buried layer of the first conductivity type;
a gate electrode, a source electrode, and a drain electrode which are disposed on the body region of the first conductivity type and the drift region of the second conductivity type, and
a second conductivity type deep well region disposed between the buried layer of the second conductivity type and the guard ring structure,
wherein the guard ring structure is disposed on the second conductivity type deep well region,
wherein the guard ring structure comprises:
a first guard ring of the second conductivity type disposed adjacent to the power device;
a second guard ring of the first conductivity type disposed adjacent to the first guard ring; and
a third guard ring of the second conductivity type disposed adjacent to the second guard ring, and
wherein the buried layer of the second conductivity type is disposed to extend to the guard ring structure.

2. The semiconductor device of claim 1, wherein the first conductivity type is different from the second conductivity type.

3. The semiconductor device of claim 1,
wherein the first guard ring is configured to surround the power device,
wherein the second guard ring is configured to surround the first guard ring, and wherein the third guard ring is configured to surround the second guard ring.

4. The semiconductor device of claim 1,
wherein each of the first guard ring and the third guard ring comprises:
a second conductivity type well; and
a second conductivity type impurity layer which is disposed within the second conductivity type well, and
wherein the second guard ring comprises:
a first conductivity type well; and
a first conductivity type impurity layer which is disposed within the first conductivity type well.

5. The semiconductor device of claim 1, wherein the guard ring structure further comprises:
a fourth guard ring of the first conductivity type disposed adjacent to the third guard ring; and
a fifth guard ring of the second conductivity type disposed adjacent to the fourth guard ring.

6. The semiconductor device of claim 1, wherein the first guard ring, the second guard ring, and the third guard ring are configured to receive a same bias voltage.

7. A semiconductor device, comprising:
a power device, which is disposed on a substrate, and comprising a gate electrode, a source electrode, and a drain electrode; and
a guard ring structure which is configured to surround the power device, wherein the guard ring structure comprises:
an N-type first guard ring disposed adjacent to the power device;
a P-type second guard ring disposed adjacent to the N-type first guard ring; and
an N-type third guard ring disposed adjacent to the P-type second guard ring, and
wherein the N-type first guard ring, the P-type second guard ring, and the N-type third guard ring are configured to receive a same first bias,
wherein the power device comprises an N-type buried layer disposed in the substrate and an N-type deep well region configured to be in contact with lower portions of the first guard ring, the second guard ring, and the third guard ring, and
wherein the N-type deep well region is disposed between the guard ring structure and the N-type buried layer.

8. The semiconductor device of claim 7, wherein the guard ring structure further comprises:
a P-type fourth guard ring disposed adjacent to the N-type third guard ring; and
an N-type fifth guard ring disposed adjacent to the P-type fourth guard ring.

9. The semiconductor device of claim 7,
wherein each of the N-type first guard ring and the N-type third guard ring comprises:
an N-type well; and
an N-type impurity layer which is disposed within the N-type well, and
wherein the P-type second guard ring comprises:
a P-type well; and
a P-type impurity layer which is disposed within the P-type well.

10. The semiconductor device of claim 7, wherein the power device further comprises:
a P-type buried layer disposed on the N-type buried layer;
a P-type body region and an N-type drift region disposed on the P-type buried layer;
an N-type source region disposed in the P-type body region; and
an N-type drain region disposed in the N-type drift region.

11. The semiconductor device of claim 7,
wherein the power device is disposed in a power block,
wherein the power block comprises a power supply voltage PVCC and a ground voltage PGND,
wherein the first bias applied to the first guard ring, the second guard ring, and the third guard ring is connected to the power supply voltage PVCC,
wherein the drain electrode of the power device is connected to the power supply voltage PVCC, so that the drain electrode and the guard ring structure are connected to the same power supply voltage PVCC,
and wherein a second bias is applied to the substrate, and the second bias is connected to the ground voltage PGND.

12. The semiconductor device of claim 10, wherein the N-type deep well region and the P-type buried layer are disposed adjacent to each other.

13. A semiconductor device, comprising:
a power device;
a circuit block region;
a guard ring structure, configured to surround the power device,
a P-type well region, configured to surround the guard ring structure, and disposed between the circuit block region and the guard ring structure,
a first buried layer of a first conductivity type disposed in a substrate; and
a deep N-type well region disposed in the substrate between the guard ring structure and the first buried layer of a first conductivity type,
wherein the guard ring structure comprises:
an N-type first guard ring;
a P-type second guard ring, and
an N-type third guard ring.

14. The semiconductor device of claim 13, further comprising:
a second buried layer of a second conductivity type disposed in the substrate.

15. The semiconductor device of claim 13, wherein the N-type first guard ring, the P-type second guard ring, and the N-type third guard ring are configured to receive a same bias voltage.

* * * * *